(12) United States Patent
Jiang

(10) Patent No.: US 9,087,763 B2
(45) Date of Patent: Jul. 21, 2015

(54) LIGHT-EMITTING DIODE DISPLAY SUBSTRATE, METHOD FOR MANUFACTURING SAME, AND DISPLAY DEVICE

(71) Applicant: BOE Technology Group Co., Ltd., Beijing (CN)

(72) Inventor: Chunsheng Jiang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 46 days.

(21) Appl. No.: 14/006,793

(22) PCT Filed: Oct. 31, 2012

(86) PCT No.: PCT/CN2012/083881
§ 371 (c)(1),
(2) Date: Sep. 23, 2013

(87) PCT Pub. No.: WO2013/135053
PCT Pub. Date: Sep. 19, 2013

(65) Prior Publication Data
US 2014/0203303 A1  Jul. 24, 2014

(30) Foreign Application Priority Data
Mar. 16, 2012 (CN) .......................... 2012 1 0071397

(51) Int. Cl.
*H01L 33/00* (2010.01)
*H01L 29/24* (2006.01)
(Continued)

(52) U.S. Cl.
CPC .......... *H01L 27/153* (2013.01); *H01L 27/3246* (2013.01); *H01L 27/3283* (2013.01); *H01L 51/0005* (2013.01); *H01L 51/5012* (2013.01); *H01L 51/56* (2013.01)

(58) Field of Classification Search
CPC ............ H01L 27/3246; H01L 51/0005; H01L 51/0004; H01L 27/3295; H01L 51/50; H01L 27/3258

USPC ............ 257/88, 59, 98, E51.018; 438/28, 29, 438/34, 99
See application file for complete search history.

(56) References Cited

U.S. PATENT DOCUMENTS

| 2005/0112341 A1 | 5/2005 | Ito et al. |
| 2005/0116620 A1 | 6/2005 | Kobayashi |

(Continued)

FOREIGN PATENT DOCUMENTS

| CN | 101399283 B | 11/2004 |
| CN | 1615060 A | 5/2005 |

(Continued)

OTHER PUBLICATIONS

First Office Action for Chinese Patent Application No. 201210071397.4 dated May 6, 2013, 4 pgs.

(Continued)

*Primary Examiner* — Shouxiang Hu

(57) ABSTRACT

A light-emitting diode (LED) display substrate, a method for manufacturing the same, and a display device are provided and involve the display field. The method for manufacturing the LED display substrate comprises: forming a transparent conductive anode (201) on a substrate (200); forming a pixel region defined by a first PDL (202) and a second PDL (203) on the substrate (200) on which the anode (201) is formed, in which the second PDL (203) made of a hydrophobic material is disposed on the first PDL (201) made of a hydrophilic material; filling a luminescent material into the pixel region to form an emission layer (204) with the luminescent material; and forming a conductive cathode (205) on the substrate (200) on which the emission layer (204) is formed. The manufacturing method allows the luminescent materials to be flatly laid on the LED display substrate so as to improve the luminous quality of the LED display substrate.

7 Claims, 3 Drawing Sheets

(51) Int. Cl.
*H01L 21/00* (2006.01)
*H01L 51/40* (2006.01)
*H01L 27/15* (2006.01)
*H01L 51/56* (2006.01)
*H01L 51/00* (2006.01)
*H01L 51/50* (2006.01)
*H01L 27/32* (2006.01)

(56) References Cited

U.S. PATENT DOCUMENTS

| | | | |
|---|---|---|---|
| 2007/0263164 | A1 | 11/2007 | Kumagai |
| 2008/0180686 | A1 | 7/2008 | Sakai et al. |
| 2009/0200931 | A1 | 8/2009 | Takei et al. |
| 2010/0200841 | A1* | 8/2010 | Cheon et al. .................. 257/40 |
| 2013/0329274 | A1* | 12/2013 | Yang et al. .................. 359/290 |
| 2013/0330868 | A1* | 12/2013 | Suh ................................ 438/34 |

FOREIGN PATENT DOCUMENTS

| | | |
|---|---|---|
| CN | 101090132 A | 12/2007 |
| CN | 101091256 A | 12/2007 |
| CN | 101231159 A | 7/2008 |
| CN | 101399283 A | 4/2009 |
| CN | 101504950 A | 8/2009 |
| CN | 102705790 A | 3/2012 |
| CN | 102709243 A | 5/2012 |
| KR | 10-2007-0045014 | 5/2007 |

OTHER PUBLICATIONS

English Translation of First Office Action for Chinese Patent Application No. 201210071397.4 dated May 6, 2013, 4 pgs.
Second Office Action for Chinese Patent Application No. 201210071397.4 dated Jan. 14, 2014, 6pgs.
English Translation of Second Office Action for Chinese Patent Application No. 201210071397.4 dated Jan. 1, 2014, 3 pgs.
International Search Report for International Application No. PCT/CN2012/083881, 14 pgs.
International Preliminary Report on Patentability for International Application No. PCT/CN2012/083881 dated Sep. 16, 2014, 6pgs.

* cited by examiner

US 9,087,763 B2

LIGHT-EMITTING DIODE DISPLAY SUBSTRATE, METHOD FOR MANUFACTURING SAME, AND DISPLAY DEVICE

CROSS REFERENCE TO RELATED APPLICATIONS

This application is based on International Application No., PCT/CN2012/083881 filed on Oct. 31, 2012 which claims priority to Chinese National Application No. 201210071397.4, filed on Mar. 16, 2012, the contents of which are incorporated herein by reference.

TECHNICAL FIELD

Embodiments of the invention relate to a light-emitting diode (LED) display substrate, a method for manufacturing the same, and a display device,

BACKGROUND

An organic light-emitting diode (OLED)/polymer light-emitting diode (PLED) display substrate comprises a glass substrate, an indium tin oxide (ITO) anode, an emitting material layer, and a cathode; the emitting material layer is sandwiched by the thin transparent ITO anode and the metal cathode. When a voltage is applied across the electrodes, holes from the anode are combined with electrons from the cathode on the emitting material layer so as to stimulate organic luminescent material(s) in the emitting material layer to emit light.

Currently, during the preparation of an LED display substrate, a photoresist is coated on a glass substrate; a pixel define layer (PDL) is formed after exposure and development to define a pixel region or pixel regions; and subsequently droplets of a luminescent material is infused into the pixel region by the ink jetprinting method. However, as the dimension of high-resolution pixels of the traditional display substrate is 30 μm×180 μm, the diameter of the droplets formed by ink-jet printing is more than 30 μm, and therefore the dimension of the droplets formed by printing and the pixels are within the same dimension range. In order to guarantee that the droplets formed by printing be smoothly, flatly and completely filled within the pixel region defined by the PDL and prevent the droplets from flowing to adjacent pixel region(s), the wetting characteristic of the surface of the PDL must be improved. Currently, 60% CF4 is mainly used for the fluorination treatment of the surface of the PDL by a chemical vapor deposition (CVD) process, so that the wetting characteristic of the surface of the PDL can be improved. However, as the method requires the additional investment for equipments, the manufacturing costs of the LED display substrate are increased accordingly, which is not advantageous to mass production.

SUMMARY

The technical problem to be solved by the invention is to provide an LED display substrate, a method for manufacturing the same, and a display device, capable of flatly laying luminescent materials on the LED display substrate and improving the luminous quality of the LED display substrate.

An aspect of the invention provides a method for manufacturing a light-emitting diode (LED) display substrate, comprising: forming a transparent conductive anode on a substrate; forming a pixel region defined by a first pixel define layer (PDL) and a second PDL on the substrate on which the anode is formed, in which the second PDL made of a hydrophobic material is disposed on the first PDL made of a hydrophilic material; filling a luminescent material into the pixel region to form an emission layer with the luminescent material; and forming a conductive cathode on the substrate on which the emission layer is formed.

In the method, for example, the thickness of the first PDL is between 0.5 and 1 μg, and the thickness of the second PDL is 0.5 μm.

In the method, for example, the first PDL is formed by a photoresist material containing SiNx, and the second PDL is formed by a photoresist material.

In the method, for example, the mass ratio of the photoresist material to the $SiN_x$ in the first PDL is 10:1.

In the method, for example, before filling the luminescent material into the pixel region to form an emission layer with the luminescent material, the method further comprises:
placing the substrate at a temperature of between 100 and 140 centigrade degree, and holding the temperature for 1 to 5 minutes so that a surface energy density of the second PDL reaches up to 60-120 $mJ/cm^2$.

Another aspect of the invention further provides an light-emitting diode (LED) display substrate, comprising: a substrate; a transparent conductive anode formed on the substrate; a pixel region formed on the substrate and defined by a first PDL and a second PDL, in which the second PDL made of a hydrophobic material is disposed on the first PDL made of a hydrophilic material; an emission layer made of a luminescent material and formed in the pixel region; and a conductive cathode formed on the substrate.

In LED display substrate, for example, the thickness of the first PDL is between 0.5 and 1 μm, and the thickness of the second PDL is 0.5 μm.

In LED display substrate, for example, the first PDL is formed by a photoresist material containing SiNx, and the second PDL is formed by a photoresist material.

In LED display substrate, for example, the mass ratio of the photoresist material to the $SiN_x$ in the first PDL is 10:1.

In LED display substrate, for example, the surface energy density of the second PDL is 60-120 $mJ/cm^2$.

Further another aspect of the invention provides a display device, comprising any of the above LED display substrates.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

Figure 1:
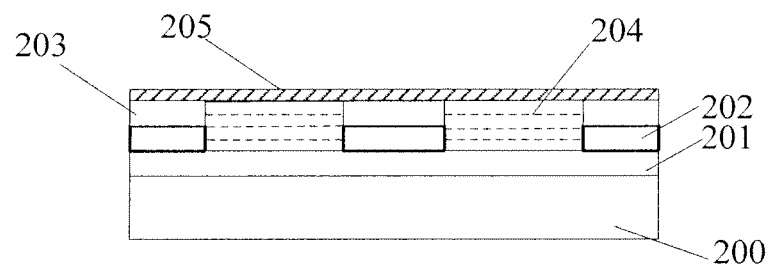
FIG. 1 is a structural view of an LED display substrate of an embodiment of the invention.

In order to make objects, technical details and advantages of the embodiments of the invention apparent, the technical solutions of the embodiments will be described in a clearly and fully understandable way in connection with the drawings related to the embodiments of the invention. Apparently, the described embodiments are just a part but not all of the embodiments of the invention. Based on the described embodiments herein, those skilled in the art can obtain other embodiment(s), without any inventive work, which should be within the scope of the invention.

The invention aims to solve the technical problems in the conventional technology that: in order to guarantee that the droplets formed by printing be smoothly, flatly and completely filled within the pixel region defined by the PDL and prevent the droplets from flowing to adjacent pixel regions, the surface of the PDL is subjected to fluorination treatment so as to improve the wetting characteristic thereof. However, as the method requires the additional investment for the equipment, the manufacturing costs of the LED display substrate are increased, which is not advantageous to mass production. An embodiment of the invention provides an LED display substrate, a method for manufacturing the same, and a display device, capable of flatly laying luminescent materials on the LED display substrate and improving the luminous quality of the LED display substrate.

The term "on" in "on the substrate" or "on the substrate on which is formed" or the like in the description indicates the positional relationship and is not limited to the case of both making direct contact with each other, but also includes the case of both not making direct contact with each other.

An embodiment of the invention provides a method for manufacturing an LED display substrate, which comprises the following steps.

Step 101: forming a transparent conductive anode on a substrate.

The substrate may be a glass substrate, and for example, a transparent conductive layer may be deposited on the glass substrate, and the anode formed by the transparent conductive layer may be formed by a photolithography process.

Step 102: forming a pixel region defined by a first PDL and a second PDL on the substrate on which the anode is formed, in which the second PDL made of a hydrophobic material is disposed on the first PDL made of a hydrophilic material.

For example, the first PDL and the second PDL can be coated sequentially on the glass substrate after the step 101 by a spin-coating method; the pixel region defined by the first PDL and the second PDL may be formed by a photolithography process; and the first PDL is made of the hydrophilic material and the second PDL is made of the hydrophobic material.

Step 103: filling a luminescent material into the pixel region to form an emission layer with the luminescent material.

Step 104: forming a conductive cathode on the substrate on which the emission layer is formed.

For example, a metal layer may be deposited on the glass substrate after the step 103 and the cathode formed by the metal layer may be formed with a photolithography process.

For example, the thickness of the first PDL is between 0.5 and 1 µm, and the thickness of the second PDL is 0.5 µm.

For example, the first PDL is formed by a photoresist material containing $SiN_x$, and the second PDL is formed by a photoresist material.

For example, before the step 103, the method may further comprise the following step of:

placing the glass substrate after the step 102 at a temperature of between 100 and 140 centigrade degree (° C.), and holding the temperature for 1 to 5 minutes so that the surface energy density of the second PDL can reach up to 60-120 $mJ/cm^2$.

In the method for manufacturing the LED display substrate, according to the embodiment of the invention, the first PDL of the manufactured LED display substrate is made of the hydrophilic material, and the second PDL is made of the hydrophobic material, thus the wetting characteristic of a PDL can be changed; on the premise of not increasing the complexity of the manufacturing process and changing the shape of the PDL, by utilizing of different wetting characteristics of the upper layer and the lower layer of the PDL, it can be guaranteed that the luminescent material is filled into the pixel region defined by the PDL, and the phenomenon that the droplets of the luminescent materials flow to the adjacent pixel regions can be avoided; and moreover, as the luminescent material is flatly laid in the pixel region defined by the PDL, the luminous quality of the LED display substrate can be improved.

FIG. 1 is a structural view of the LED display substrate of the embodiment of the invention. As shown in FIG. 1, the LED display substrate in the embodiment comprises a substrate 200; for example, the substrate 200 may be a glass substrate. A transparent conductive anode is formed on the substrate 200, and for example, the anode includes a transparent conductive layer 201.

A pixel region is formed on the substrate 200 and defined by a first PDL 202 and a second PDL 203; the second PDL 203 is made of a hydrophobic material is disposed on the first PDL 202 that is made of a hydrophilic material.

An emission layer 204 is made of a luminescent material and formed in the pixel layer.

A conductive cathode is formed on the substrate 200, and for example, the cathode is formed by a metal layer 205.

For example, the thickness of the first PDL 202 is between 0.5 and 1 µm, and the thickness of the second PDL 203 is 0.5 µm.

For example, the first PDL 202 is formed by a photoresist material containing $SiN_x$, and the second PDL 203 is formed by a photoresist material.

For example, the mass ratio of the photoresist material to the $SiN_x$ in the first PDL 202 is 10:1.

For example, the surface energy density of the second PDL 202 is 60-120 $mJ/cm^2$.

In the LED display substrate provided by the embodiment of the invention, the first PDL is made of the hydrophilic material and the second PDL is made of the hydrophobic material, and therefore the wetting characteristic of the PDL can be changed; on the premise of not increasing the complexity of the manufacturing process and changing the shape of the PDL, by utilizing different wetting characteristics of the upper layer and the lower layer of the PDL, it can be guaranteed that the luminescent material is filled into the pixel region defined by the PDL, and the phenomenon that the droplets of the luminescent material flow to the adjacent pixel regions can be avoided; and moreover, as the luminescent material is flatly laid in the pixel region defined by the PDL, the luminous quality of the LED display substrate can be improved.

An embodiment of the invention also provides a display device, which comprises the LED display substrate as illustrated in FIG. 1.

Figure 2:
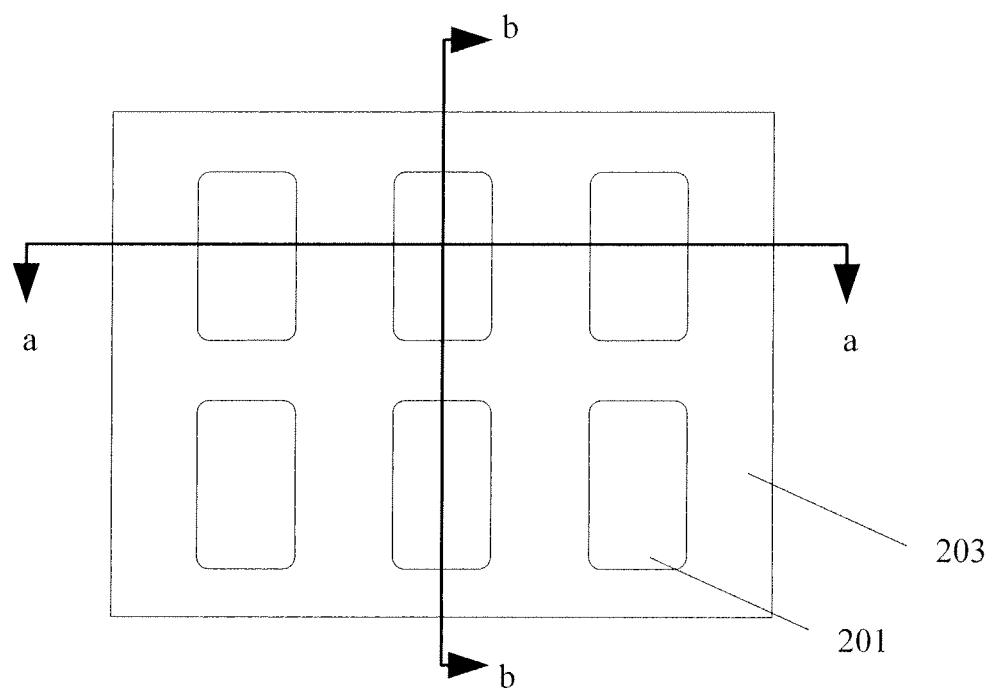
FIG. 2 is a plan view of a glass substrate after second photolithography process in a method for manufacturing the LED display substrate according to the embodiment of the invention.

For example, the LED display substrate provided by the invention may be formed by a method including three photolithography processes. Firstly, a transparent conductive layer is deposited on a glass substrate 200, and an anode formed by the transparent conductive layer 201 is formed by a first photolithography process; secondly, a first PDL 202 and a second PDL 203 are coated sequentially on the glass substrate after the first photolithography process by a spin-coating method, and a pixel region defined by the first PDL 202 and the second PDL 203 is formed by a second photolithography process, and as shown in FIG. 2 which is a plan view of the glass substrate after the second photolithography process, the first PDL 202 is made of a hydrophilic material and the second PDL 203 is made of a hydrophobic material; thirdly, a luminescent material is filled into the pixel region to form an emission layer 204 made of the luminescent material; and fourthly, a metal layer 205 is deposited on the glass substrate after the formation of the emission layer 204, and a cathode formed by the metal layer 205 is formed by a third photolithography process. In the display substrate of the embodiment, by utilizing the different wetting characteristics of the first PDL 202 and the second PDL 203 respectively on the upper and lower layers, the luminescent material is filled into the pixel region defined by the PDL, and the phenomenon that droplets of the luminescent material flow to adjacent pixel regions can be avoided. Moreover, the luminescent material can be flatly laid in the pixel region defined by the PDL.

Further description is given below to the LED display substrate provided in an embodiment of the invention and the method for manufacturing the same with reference to the accompanying drawings 2-8. The technical solutions according to the embodiments of the invention is applicable to the method for manufacturing LED display substrates such as a passive matrix organic light-emitting diode (PMOLED) display substrate or an active matrix organic light-emitting diode (AMOLED) display substrate. For the convenience of description, two cross sections respectively along the a-a and b-b lines are combined herein to describe the structure and manufacturing process of the LED display substrate.

Figure 3:
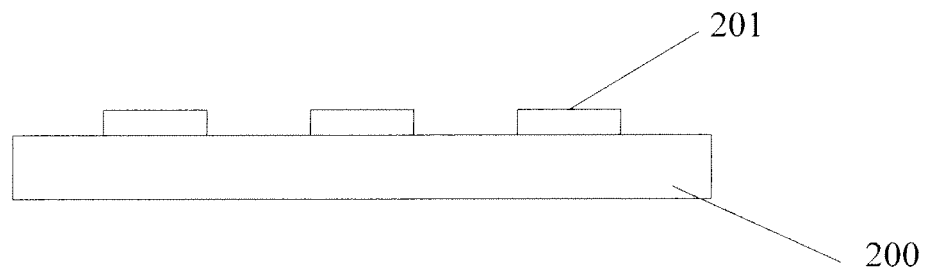
FIG. 3 is a sectional view of the glass substrate along the a-a line after first photolithography process in the method for manufacturing the LED display substrate according to the embodiment of the invention.
Figure 4:
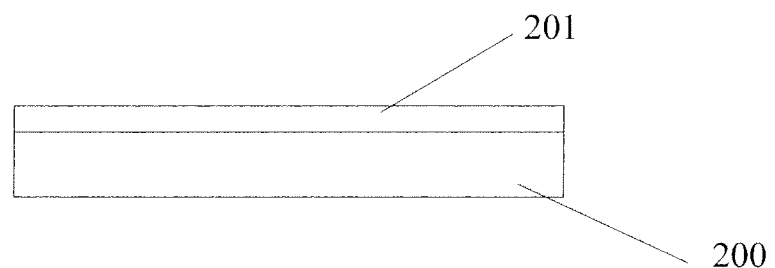
FIG. 4 is a sectional view of the glass substrate along the b-b line after first photolithography process in the method for manufacturing the LED display substrate according to the embodiment of the invention.

As illustrated in FIG. 3, a transparent conductive layer 201 is deposited on a glass substrate 200, and for example, the transparent conductive layer may be an ITO layer and taken as an anode material for the LED display substrate. In addition, an anode formed by the transparent conductive layer 201 is formed by a photolithography process. FIG. 3 is a sectional view of the glass substrate along the a-a line after the first photolithography process, and FIG. 4 is a sectional view of the glass substrate along the b-b line after the first photolithography process. The photolithography processes applied in the embodiments of the invention includes the processes of photoresist coating, masking, exposing, developing, etching, photoresist peeling, and the like. Moreover, a positive photoresist is taken as an example.

Figure 5:
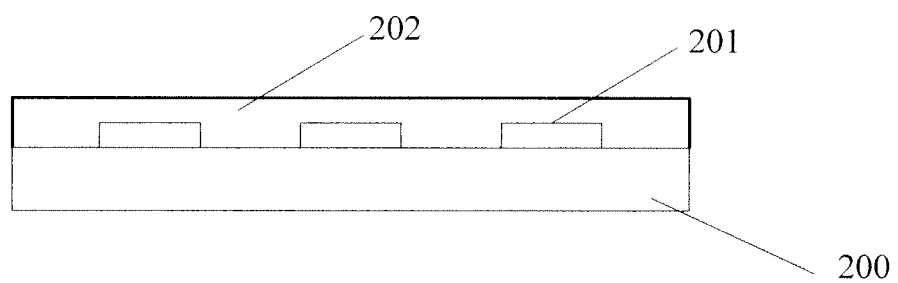
FIG. 5 is a sectional view of the glass substrate along the a-a line after the spin coating of a first PDL in the method for manufacturing the LED display substrate according to the embodiment of the invention.
Figure 6:
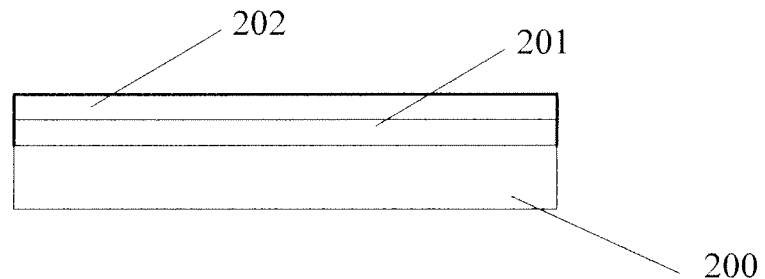
FIG. 6 is a sectional view of the glass substrate along the b-b line after the spin coating of the first PDL in the method for manufacturing the LED display substrate according to the embodiment of the invention.

Firstly, by adding $SiN_x$ nanometer powders into a material for forming a PDL, the wetting characteristic of the material for forming the PDL can be changed. For example, a photoresist material can be used for the material for forming the PDL. The mass ratio of the photoresist material to $SiN_x$ may be 10:1 by mixing in a solution state, where x in the $SiN_x$ is ranged from 1 to 4/3. Secondly, a film, i.e., a first PDL 202, as the lower layer of the PDL, is formed on the glass substrate after the first step with the photoresist material mixed with the $SiN_x$ nanometer powders by the spin-coating method. FIG. 5 is a sectional view of the glass substrate along the a-a line after the spin coating of the first PDL 202, and FIG. 6 is a sectional view of the glass substrate along the b-b line after the spin coating of the first PDL 202. For example, the thickness of the first PDL may be between 0.5 and 1 μm. By adoption of the photoresist material added with the $SiN_x$ nanometer powders as the hydrophilic material, the first PDL 202 has hydrophilicity.

Similarly, a film, i.e., a second PDL 203, as the upper layer of the PDL, is formed on the glass substrate after the second step by a PDL material not mixed with $SiN_x$ nanometer powders (for example a photoresist material not mixed with the $SiN_x$ nanometer powders) by the spin-coating method. For example, the thickness of the second PDL 203 may be 0.5 μm. As the photoresist material for forming the second PDL 203 is not mixed with the $SiN_x$ nanometer powders, the second PDL 203 has hydrophobicity.

Figure 7:
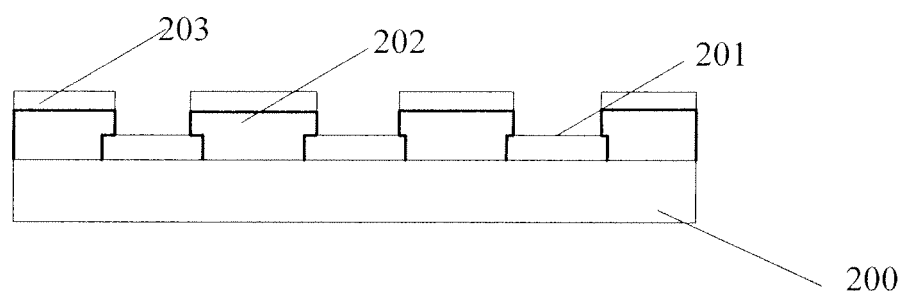
FIG. 7 is a sectional view of the glass substrate along the a-a line after second photolithography process in the method for manufacturing the LED display substrate according to the embodiment of the invention.
Figure 8:
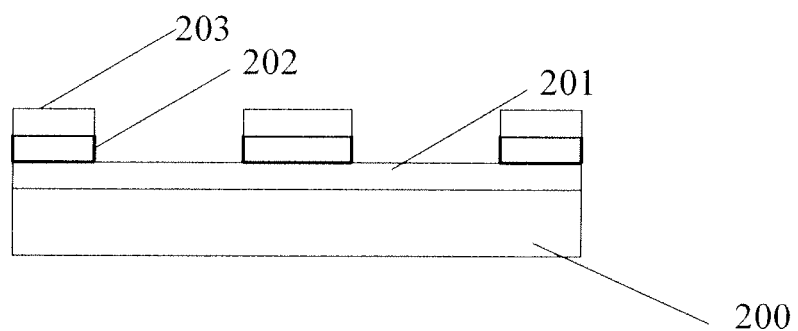
FIG. 8 is a sectional view of the glass substrate along the b-b line after second photolithography process in the method for manufacturing the LED display substrate according to the embodiment of the invention.

The pixel region defined by the first PDL 202 and the second PDL 203 is formed by a photolithography process. FIG. 2 is a plan view of the glass substrate after secondary photolithography process; FIG. 7 is a sectional view of the glass substrate along the a-a line after the second photolithography process; and FIG. 8 is a sectional view of the glass substrate along the b-b line after the second photolithography process.

The glass substrate after the fourth step is subjected to annealing for 1 to 5 minutes at a temperature of between 100 and 140 centigrade degree. After the annealing treatment, the surface energy density of the upper layer of the PDL, i.e., the second PDL 203, can reach up to 60-120 mJ/cm$^2$, and the hydrophilicity of the lower layer of the PDL, i.e., the first PDL 202, can be maintained due to the action of the $SiN_x$ nanometer powder. As such, the PDL including the hydrophobic upper layer and the hydrophilic lower layer can be obtained.

The luminescent material is filled into the pixel region to form an emission layer 204 by the luminescent material. For example, the luminescent material may be filled into the pixel region by vapor deposition, spin coating or inkjet printing. As the upper layer of the PDL is made of a normal PDL material and hence has hydrophobicity, and the lower layer of the PDL is made of the PDL material mixed with the hydrophilic $SiN_x$ powders and hence has hydrophilicity. Therefore, the upper and lower layers of the PDL have different wetting characteristics. When the luminescent material is filled into the pixel region defined by the PDL of the aforesaid structure, the luminescent material subjected to vapor deposition, spin coating or inkjet printing can be guaranteed to be flatly laid in the pixel region defined by the PDL and can not flow to the adjacent pixel regions, so that the luminous quality of the LED display substrate can be improved.

A metal layer 205 is deposited on the glass substrate after the above steps, and a cathode formed by the metal layer 205 is formed by a photolithography process. FIG. 1 is a sectional view of the glass substrate along the b-b line after the third photolithography process.

An LED display substrate can be manufactured by the above steps. In the LED display substrate manufactured according to the embodiment, as the first PDL is made of the hydrophilic material and the second PDL is made of the hydrophobic material, the wetting characteristic of the PDL can be changed. Moreover, on the premise of not increasing the complexity of the manufacturing process and changing the shape of the PDL, by utilizing the different wetting characteristics of the upper layer and the lower layer of the PDL, it can be guaranteed that the luminescent material is filled into the pixel region defined by the PDL, and the phenomenon that the droplets of the luminescent material flow to the adjacent pixel regions can be avoided. Furthermore, the luminescent materials are flatly laid in the pixel region defined by the PDL, so that the luminous quality of the LED display substrate can be improved.

The serial numbers of the steps cannot be used to define the sequence of the steps of the various methods according to the embodiments of the invention. It should be understood by those skilled in the relevant technical field that the sequence changes of various steps also fall within the scope of protection of the invention.

The foregoing is only illustrative of the embodiments of the invention and not construed as to limit the scope of protection of the invention. The scope of protection of the invention is only limited by the claims.

The invention claimed is:

1. A method for manufacturing a light-emitting diode (LED) display substrate, comprising:
    forming a transparent conductive anode on a substrate;
    forming a pixel region defined by a first pixel define layer (PDL) and a second PDL on the substrate on which the anode is formed, in which the second PDL made of a hydrophobic material is disposed on the first PDL made of a hydrophilic material;
    filling a luminescent material into the pixel region to form an emission layer with the luminescent material;
    forming a conductive cathode on the substrate on which the emission layer is formed; and
    the first PDL is formed by a photoresist material containing SiNx, and the second PDL is formed by a photoresist material, the mass ratio of the photoresist material to the SiNx in the first PDL is 10:1.

2. The method for manufacturing the LED display substrate according to claim 1, wherein the thickness of the first PDL is between 0.5 and 1 μm, and the thickness of the second PDL is 0.5 μm.

3. The method for manufacturing the LED display substrate according to claim 1, wherein before filling the luminescent material into the pixel region to form an emission layer with the luminescent material, the method further comprises:
    placing the substrate at a temperature of between 100 and 140 centigrade degree, and holding the temperature for 1 to 5 minutes so that a surface energy density of the second PDL reaches up to 60-120 mJ/Fcm2.

4. An light-emitting diode (LED) display substrate, comprising:
    a substrate;
    a transparent conductive anode formed on the substrate;
    a pixel region formed on the substrate and defined by a first PDL and a second PDL, in which the second PDL made of a hydrophobic material is disposed on the first PDL made of a hydrophilic material;
    an emission layer made of a luminescent material and formed in the pixel region; and
    a conductive cathode formed on the substrate; and
    first PDL is formed by a photoresist material containing SiNx, and the second PDL is formed by a photoresist material, the mass ratio of the photoresist material to the SiNx in the first PDL is 10:1.

5. The LED display substrate according to claim 4, wherein the thickness of the first PDL is between 0.5 and 1 μm, and the thickness of the second PDL is 0.5 μm.

6. The LED display substrate according to claim 5, wherein the surface energy density of the second PDL is 60-120 mJ/cm2.

7. A display device, comprising the LED display substrate according to claim 4.

* * * * *